United States Patent [19]
Lee

[11] Patent Number: 5,590,077
[45] Date of Patent: Dec. 31, 1996

[54] SEMICONDUCTOR MEMORY DEVICE

[75] Inventor: Dong M. Lee, Kyungki-Do, Rep. of Korea

[73] Assignee: Hyundai Electronics Industries Co., Ltd., Kyungki-Do, Rep. of Korea

[21] Appl. No.: 383,003

[22] Filed: Feb. 3, 1995

[30] Foreign Application Priority Data

Feb. 7, 1994 [KR] Rep. of Korea .................. 94-2245

[51] Int. Cl.$^6$ ................................................. G11C 13/00
[52] U.S. Cl. ...................................... 365/189.05; 365/206
[58] Field of Search .................. 365/189.01, 189.05, 365/189.07, 206

[56] References Cited

U.S. PATENT DOCUMENTS

| | | |
|---|---|---|
| 4,194,130 | 3/1980 | Moench . |
| 4,698,788 | 10/1987 | Flannagan et al. . |
| 4,731,761 | 3/1988 | Kobayashi . |
| 4,791,615 | 12/1988 | Pelley, III et al. . |
| 5,452,260 | 9/1995 | Matsui et al. ................ 365/230.03 |

*Primary Examiner*—Terrell W. Fears
*Attorney, Agent, or Firm*—Fish & Richardson P.C.

[57] ABSTRACT

A semiconductor memory device. The semiconductor memory device can decrease momentary peak current and noise by operating individually many row decoder groups depending on the output signals of a plurality of repeaters controlled by a block select address signal and an output signal of a row predecoder.

3 Claims, 3 Drawing Sheets

5,590,077

SEMICONDUCTOR MEMORY DEVICE

FIELD OF THE INVENTION

The present invention relates to a semiconductor memory device, and more particularly to a semiconductor memory device which can decrease momentary peak current and noise by operating individually many row decoder groups depending on the output signals of a plurality of repeaters controlled by a block select address signal and an output signal of a row predecoder.

INFORMATION DISCLOSURE STATEMENT

In general, memory devices such as 16M, 64M and 256M DRAMs are highly integrated and operate at high speed of 60 ns, 50 ns and 40 ns. The higher the integration and operating speed of a DRAM, the larger is the drive size of a row predecoder, because the output load of the row predecoder is increased and the momentary peak current is increased during an operation of the memory device.

A conventional semiconductor memory device is described below with reference to FIG. 1A and FIG. 1B.

In a conventional semiconductor memory device, as shown in FIG. 1A, output signals Axi and Axj of a row address buffer 1 are inputted to a row predecoder 2. The row predecoder 2 is connected to a plurality of row decoder groups D1 to DN connected to a plurality of memory blocks M1 to MN, respectively. Therefore an output signal Axij of the row predecoder 2 is inputted to the plurality of row decoder groups D1 to DN.

If the output signals Axi and Axj of the row address buffer 1 are inputted to a NAND gate G1 of the row predecoder 2 with a "High" potential level, as shown in FIG. 1B, the output signal Axij via inverters G2, G3 and G4 is maintained at a "High" potential level and is inputted to the plurality of row decoder groups D1 to DN. However, when the plurality of row decoder groups D1 to DN are operated by the output signal Axij of the row predecoder 2, a large load is applied to the row predecoder 2. Thus, the higher the integration of a semiconductor device, the larger is the required drive size of the row predecoder. As a result of increasing the drive size of the row predecoder, peak current of the output signal Axij increases and noise occurs when a semiconductor memory device is operated.

SUMMARY OF THE INVENTION

It is the object of the present invention to provide a semiconductor memory device which has many row decoder groups which can be operated individually by the output signals of a plurality of repeaters controlled by the block select address signal and the output signal of the row predecoder.

A semiconductor memory device according to the present invention comprising: a row address buffer; a row predecoder connected to the row address buffer; a plurality of repeaters which are controlled by block select address signals connected to the row predecoder; a plurality of row decoder groups connected to the repeaters; and a plurality of memory blocks connected to the row decoder groups.

The row predecoder consists of: a NAND gate to which output signals of the row address buffer are inputted; a first inverter connected to the output of the NAND gate; and a second inverter connected to the output of the first inverter.

Each of the repeaters consists of: a first transistor connected between a supply voltage source and a node K and controlled by a block select address signal; a second transistor connected between the node K and the row predecoder and controlled by the block select address signal; and an inverter connected between the node K and an row decoder group.

BRIEF DESCRIPTION OF THE DRAWINGS

To better understand the nature and the object of the present invention, reference should be made to the following detailed descriptions made conjunction with the accompanying drawings in which.

The reference characters refer to the corresponding parts in the various drawings.

DETAILED DESCRIPTION OF THE INVENTION

Figure 1A:
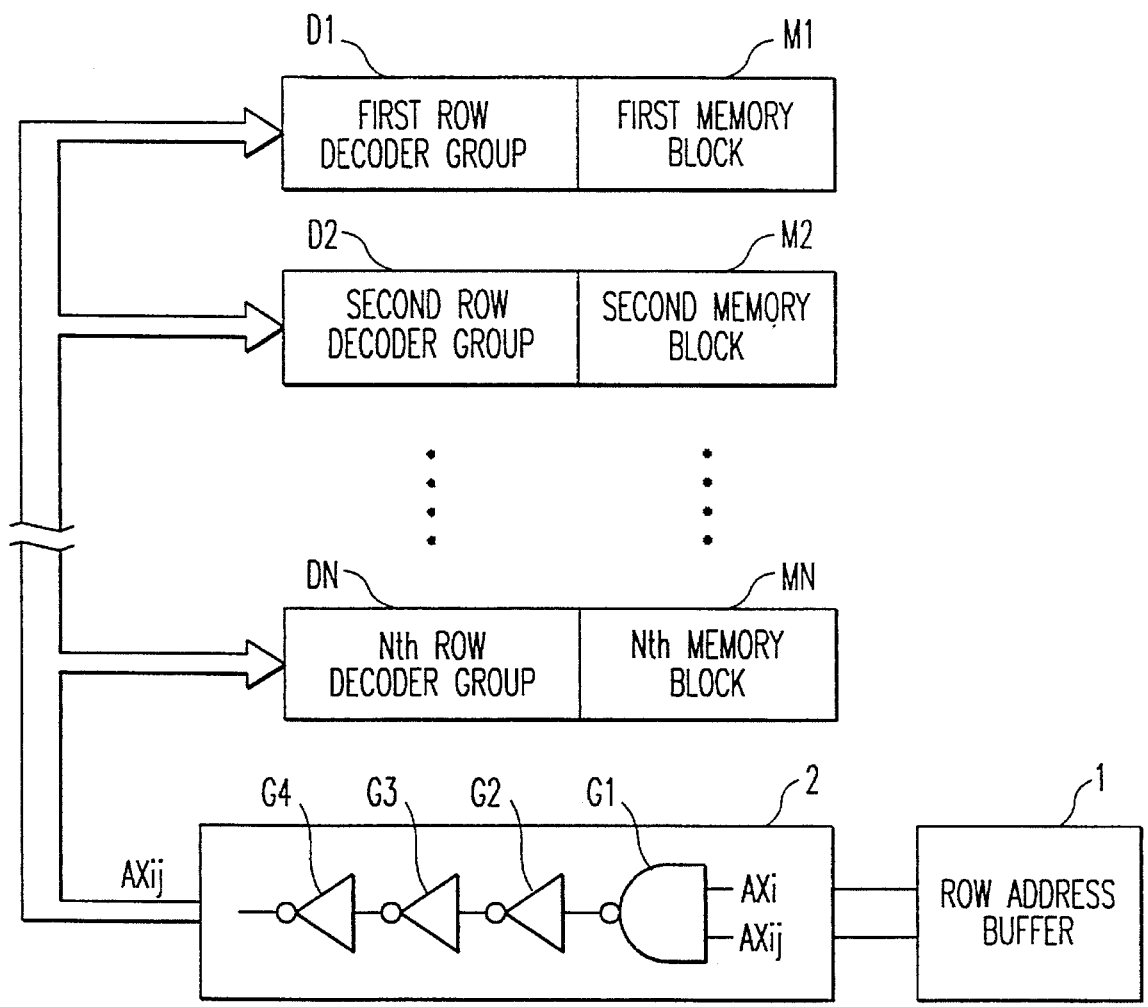
FIG. 1A is a block diagram of a conventional semiconductor memory device.
Figure 1B:
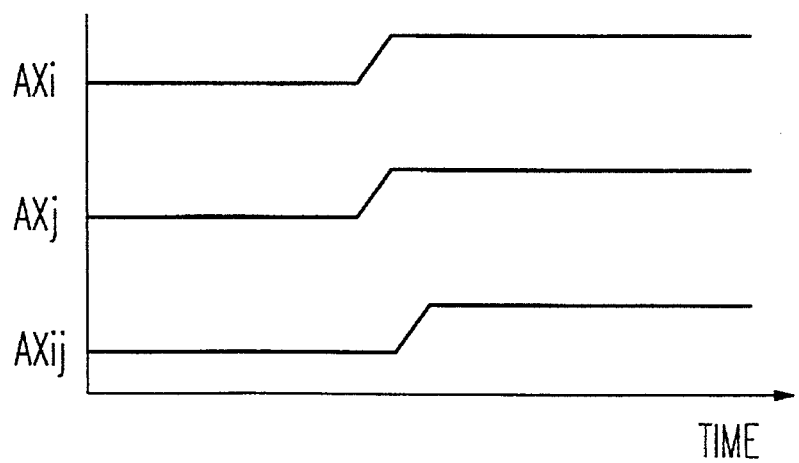
FIG. 1B is a timing chart explaining the operation of the FIG. 1A.
Figure 2A:
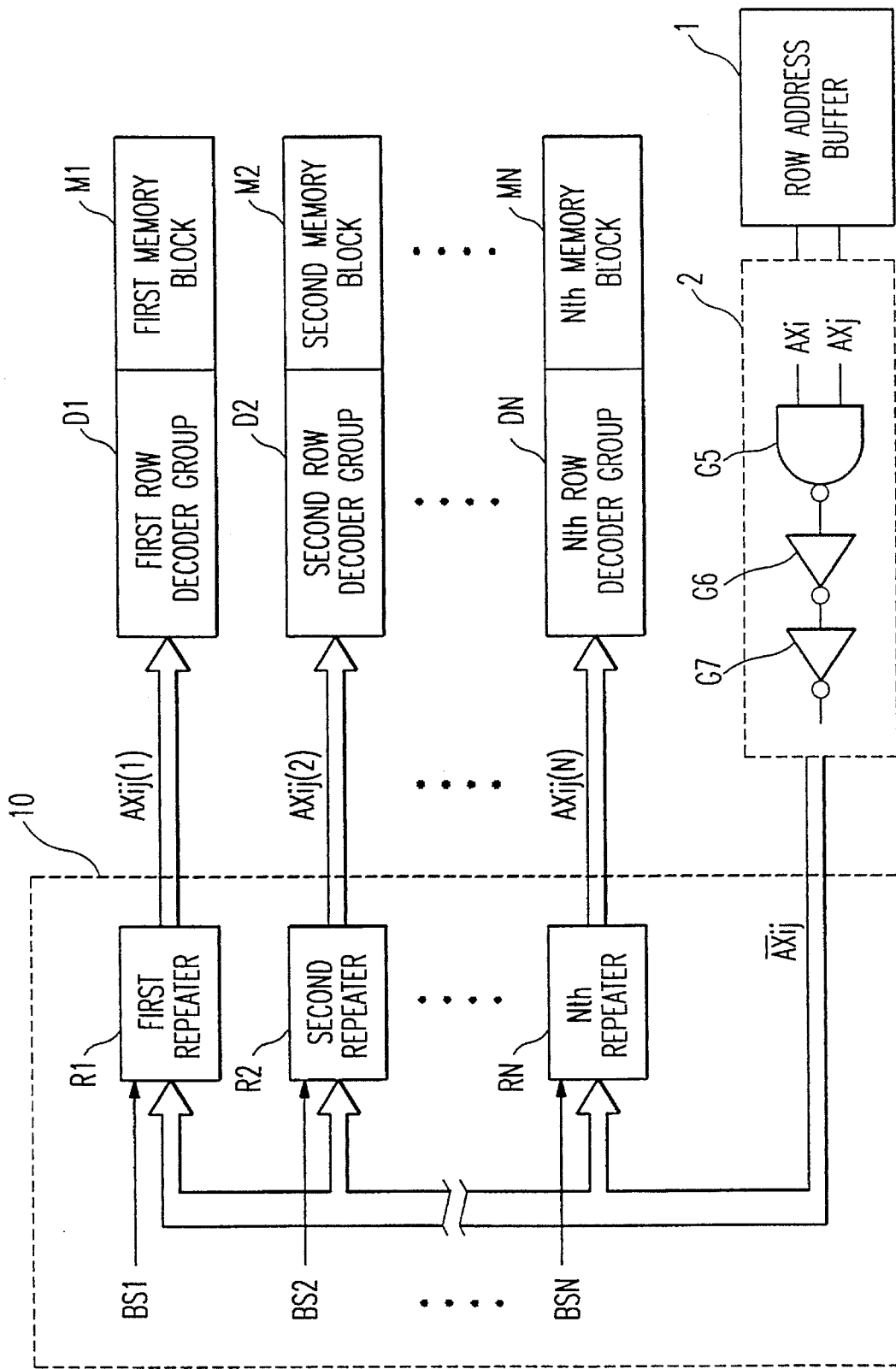
FIG. 2A is a block diagram of a semiconductor memory device according to the present invention.

FIG. 2A is a block diagram of semiconductor memory device according to the present invention.

If the output signals Axi and Axj of the row address buffer 1 are inputted to a NAND gate G5 of the row predecoder 2 in condition of a "High" potential level, as shown in PIG. 2C, the output signal $\overline{Axij}$ passed through inverters G6 and G7 is maintained at a "Low" potential level and is inputted to the plurality of repeaters R1 to RN. At this time, for example a block select address signal BS1 among BS1 through BSN is inputted to the first repeater R1 in condition of a "High" potential level, the first repeater R1 of a repeater group 10 is only enabled, therefor a word line for a first memory block M1 is enabled by operation of a first row decoder group D1. Namely, a repeater to which block select address signal is inputted in condition of a "High" potential level is only operated, while residual repeaters are disabled.

For example, if a drive size of the row predecoder is W and the number of the repeaters is N, the drive size of the row predecoder 2 is reduced to W/N. Accordingly the load which is applied to output of the row predecoder 2 is reduced, therefor the noise are decreased by a reduction of the peak current.

Figure 2B:
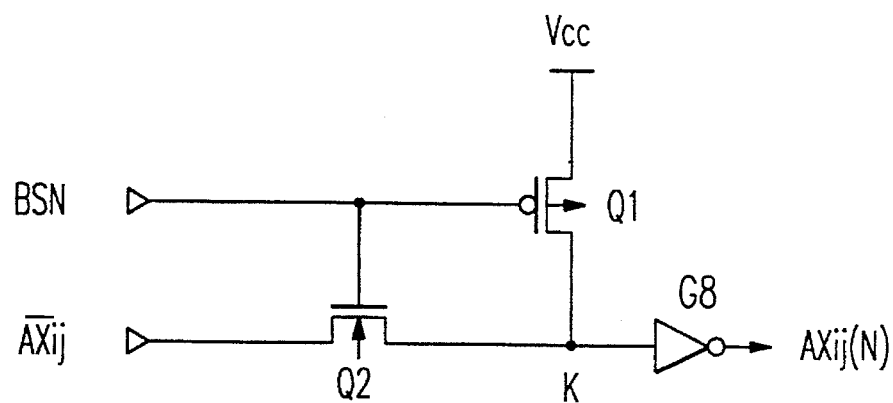
FIG. 2B is a detailed circuit of a repeater from FIG. 2A.
Figure 2C:
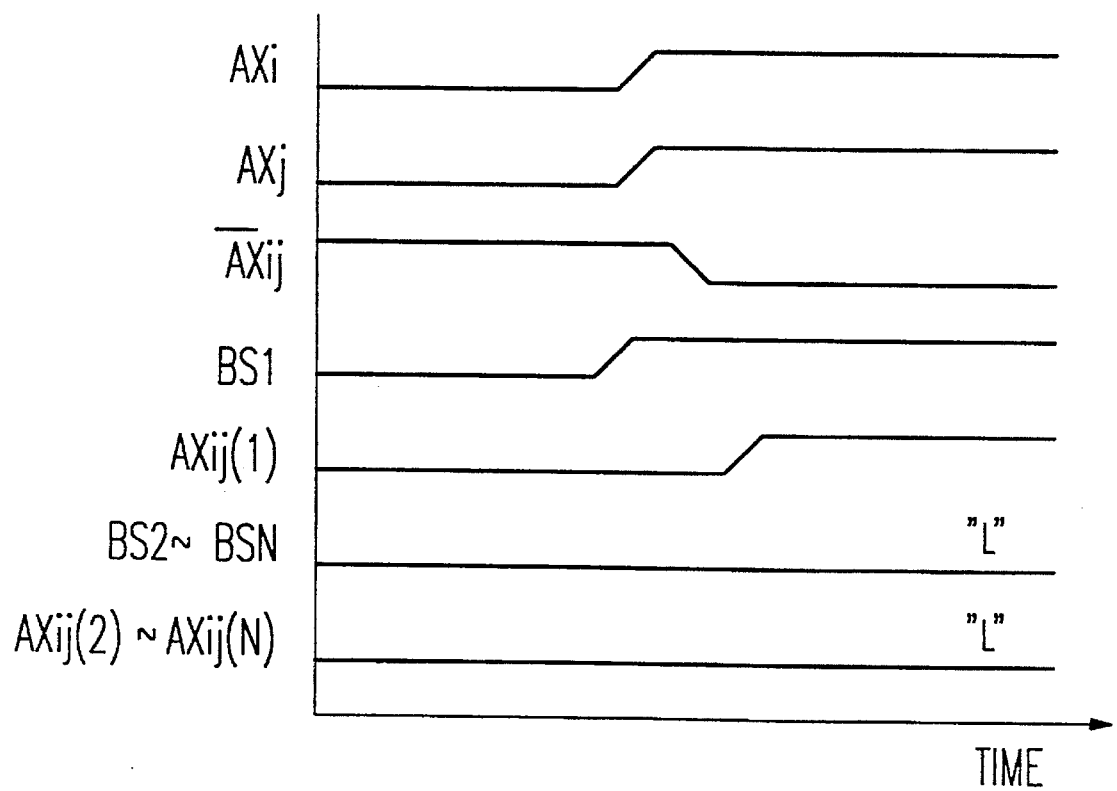
FIG. 2C is a timing chart explaining the operation of the FIG. 2A.

FIG. 2B is a detailed circuit of a repeater from FIG. 2A.

A transistor Q1 is connected between a supply voltage source Vcc and a node K and controlled by the block select address signal. A transistor Q2 is connected between the node K and the row predecoder 2 and controlled by the block select address signal. An inverter G8 is connected between the node K and the row decoder group.

For example, if the output signal $\overline{Axij}$ of the row predecoder 2 is a "Low" potential level and the block select address signal BSN is a "High" potential level, the output of the inverter G8 is maintained at a "High" potential level, while if the block select address signal BSN is a "Low" potential level, the output of the inverter G8 is maintained at a "Low" potential level.

As described above, the present invention permits many row decoder groups to be operated individually by the output signals of a plurality of repeaters controlled by a block select address signal, thereby decreasing both momentary peak current and noise.

What is claimed is:

1. A semiconductor memory device comprising:

a row address buffer, a row predecoder connected to said row address buffer, a plurality of row decoder groups and a plurality of memory blocks connected to said row decoder groups, respectively, and a plurality of repeaters connected between said row predecoder and said row decoder groups in a way such that any one of said row decoder groups is selected by an output signal of said row predecoder and each block select address signal which is inputted to said repeaters, respectively.

2. A semiconductor memory device of claim 1, wherein said row predecoder comprises:

a NAND gate to which output signals of said row address buffer are inputted;

a first inverter connected to the output of said NAND gate; and a second inverter connected to the output of said first inverter.

3. A semiconductor memory device of claim 1, wherein each of said repeaters comprise:

a first transistor connected between a supply voltage source and a node K and controlled by a block select address signal;

a second transistor connected between said node K and said row predecoder and controlled by said block select address signal; and an inverter connected between said node K and a row decoder group.

\* \* \* \* \*